United States Patent [19]
Amada et al.

[11] 4,305,133
[45] Dec. 8, 1981

[54] RECURSIVE TYPE DIGITAL FILTER

[75] Inventors: Eiichi Amada, Kokubunji; Makoto Ohnishi, Tokyo; Hiroshi Kuwahara, Kodaira, all of Japan

[73] Assignee: Hitachi, Ltd., Tokyo, Japan

[21] Appl. No.: 94,915

[22] Filed: Nov. 16, 1979

[30] Foreign Application Priority Data

Nov. 24, 1978 [JP] Japan .................... 53-144161

[51] Int. Cl.³ .................... G06F 15/31; G06F 7/48
[52] U.S. Cl. .................... 364/724; 364/745
[58] Field of Search .................... 364/724, 745

[56] References Cited

U.S. PATENT DOCUMENTS

| | | | |
|---|---|---|---|
| 3,609,568 | 9/1971 | Jackson | 364/724 X |
| 3,725,687 | 4/1973 | Heightley | 364/724 |
| 3,749,895 | 7/1973 | Kao | 364/724 X |
| 3,777,130 | 12/1973 | Croisier et al. | 364/724 |
| 4,034,196 | 7/1977 | Butterweck et al. | 364/724 X |
| 4,117,541 | 9/1978 | Ali | 364/724 |

Primary Examiner—Jerry Smith
Attorney, Agent, or Firm—Craig and Antonelli

[57] ABSTRACT

A recursive type digital filter receiving a digital input signal x(n) having a plurality of bits and delivering a digital output signal y(n) satisfying the following equation, $$y(n) = \sum_{k=0}^{M} a_k x(n-k) + \sum_{k=1}^{N} b_k y(n-k),$$

where n indicates a natural number, M and N orders of time lag in the signal transference, $a_k$ and $b_k$ coefficients defined by a filter characteristic, $a_M$ and $b_N$ being coefficients which are not equal to zero, comprises an output control circuit for delivering a digital signal indicating a positive or negative limit value in place of the digital output signal y(n) when the amplitude of the signal y(n) exceeds an allowable value. In combination with this output control circuit, the filter also utilizes a feedback signal for calculation purposes which feedback signal has its amplitude reduced from that of y(n) by a predetermined ratio. Further, an arrangement is provided for clearing registers of filter when necessary to prevent overflow oscillation.

11 Claims, 6 Drawing Figures

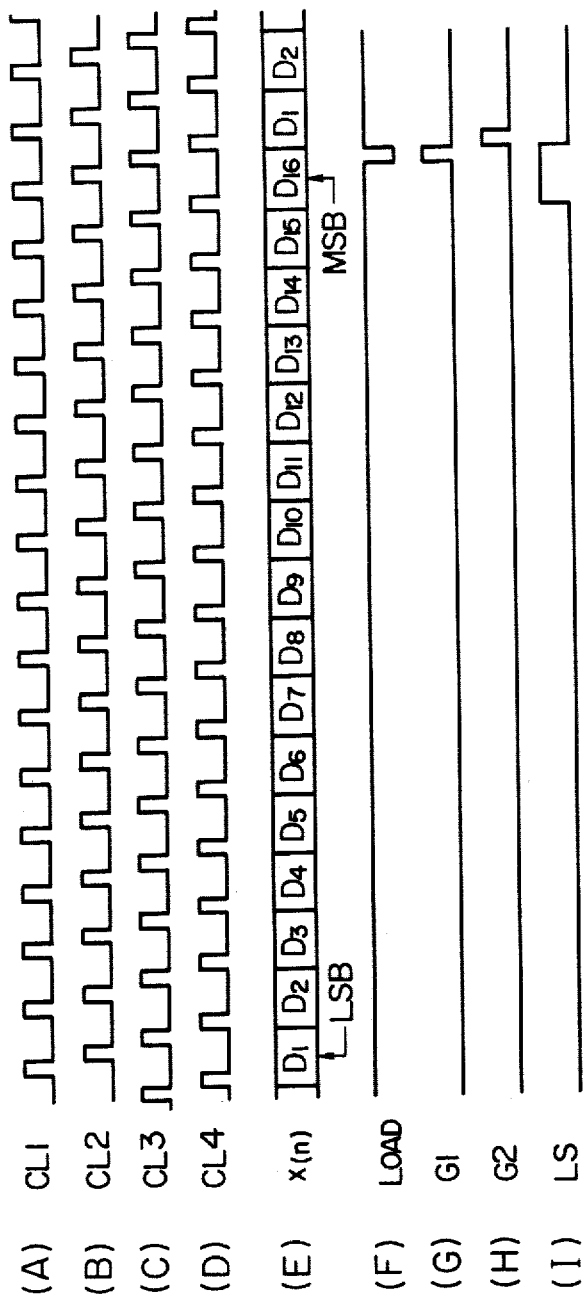

RECURSIVE TYPE DIGITAL FILTER

The present invention relates to a digital filter, and more particularly to a recursive type digital filter free from an abnormal output due to data overflow.

With the advance of semiconductor integrated circuit technology, various kinds of digital filters have been developed which can take the place of conventional analog filters.

The so-called recursive type digital filter is made of signal delaying means, coefficient multipliers and signal adding means, and delivers the following L-bit signal y(n) corresponding to a sampled input signal x(n) which is an L-bit digital signal:

$$y(n) = \sum_{k=0}^{M} a_k x(n-k) + \sum_{k=1}^{N} b_k y(n-k) \quad (1)$$

where n denotes a natural number for indicating a sampling time, $a_k$ and $b_k$ coefficients defined by the filter characteristic, k a natural number for indicating an order of time lag from the sampling time n, and M and N natural numbers.

As can be understood from equation (1), in the recursive type digital filter, the output signal of the signal adding means is fed back through the signal delaying means to the signal adding means. The signal delaying means may be constituted by, for example, shift registers which, however, have a finite bit length. Accordingly, when the result of addition becomes greater than the maximum data value which the signal delaying means can represent, an overflow takes place to cause abnormal data to be fed back to the signal adding means. Further, once the overflow takes place, it exerts a sustaining effect on the signal delaying means included in the feedback circuit, and, therefore, the problem exists of the overflow taking place continuously. The continuation of such an overflow gives rise to an overflow oscillation when no input exists, and makes the output of the digital filter far different from the expected output when an input exists. In order to solve the above problems encountered with the conventional recursive type digital filter, U.S. Pat. No. 3,676,654 has proposed the following method. In this patent, means are provided for monitoring the value of feedback data and generating a signal when the value of feedback data is greater than a predetermined value. When this occurs data held in the signal delaying means of the feedback circuit are reset by the output signal of the monitoring means to stop the overflow oscillation.

As an example of the recursive type digital filter, a so-called combinatorial type digital filter is known which has been proposed in U.S. Pat. No. 3,777,130. In this combinatorial type digital filter, the multiplication of signals x(n-k) and y(n-k) by respective coefficients $a_k$ and $b_k$ as well as the summation $\epsilon$ of the products thus obtained are carried out by the use of memory means and arithmetic means. The signals x(n-k) and y(n-k) are inputted, in parallel and bit by bit, to the memory. Further, the memory previously stores therein data representative of the sum of the products as a result of multiplication of the individual parallel-inputted bits by corresponding coefficients $a_k$ and $b_k$ for all combinations of the inputted bits, such data participating in the generation of the final result of y(n). The stored data are addresssed by the parallel-inputted bits to be read out.

The arithmetic means carries out the summation of the newly read-out data and the accumulated data which have been obtained and shifted by one bit each time data are read out from the memory, and calculates at the end of each sampling period the parallel data corresponding to the final result y(n). The parallel data are sent out in series to a filter output terminal in synchronism with the reception of data at the next sampling period. Such a combinatorial type digital filter has an advantage in that the filter characteristic thereof can be varied merely by changing the contents of the memory, without changing the hardware of the filter. However, the combinatorial type digital filter has a drawback such that, when the value of the final result y(n) becomes greater than a predetermined value, an overflow also takes place and the filter delivers an abnormal output signal.

An object of the present invention is to provide a recursive type digital filter in which an abnormal operation is prevented.

Another object of the present invention is to provide a recursive type digital filter in which, even when the result of the calculation carried out within the filter is greater than an allowable amplitude of the output signal of the filter, the result of the calculation can be reflected in the calculation at the next sampling period.

A further object of the present invention is to provide a recursive type digital filter in which only a little distortion is produced in the output signal of the filter even when the result of the calculation conducted within the filter is greater than an allowable amplitude of the output signal.

In order to attain the above objects, according to the present invention, there is provided a recursive type digital filter comprising: an arithmetic unit having an input and output means for delivering from the output means thereof a digital signal y(n) shown by a formula, $$y(n) = \sum_{k=0}^{M} a_k \cdot x(n-k) + \sum_{k=1}^{N} b_k \cdot y(n-k)$$

where n represents a natural number, N and M are orders representing a delay of signal transmission, and $a_k$ and $b_k$ are coefficients with $a_M$, $b_N \neq 0$; first means connected to the input means for applying digital signals x(n-k) to the arithmetic unit, the digital signal x(n-k) having a plurality of bits and including at least an input digital signal x(n) applied thereto at a predetermined sampling period; second means connected between the output means and the input means of the arithmetic unit for feeding back at least a digital signal y(n-k) to the input means of the arithmetic unit, the digital signal y(n-k) having a plurality of bits; a filter output terminal coupled to the output means of the arithmetic unit for delivering a digital signal y(n) as the output of the filter; third means connected to the arithmetic unit for detecting that the amplitude of the digital signal y(n) to be applied to the filter output terminal exceeds a predetermined value; and fourth means, connected between the filter output terminal and the third means and controlled by the third means, for sending to the filter output terminal a digital signal indicating either one of positive and negative limit values in place of the digital signal y(n) from the arithmetic unit.

In addition to the above-mentioned characterizing means, a recursive type digital filter according to the present invention may include means for compressing the amplitude of a digital in the arithmetic unit and for expanding the result of calculation sent out to the filter output terminal. Owing to the above means, the result of calculation at the preceding sampling period can be fed back without producing any overflow within the filter, and therefore the filtering operation can be conducted in accordance with a predetermined signal transfer function.

The foregoing and other objects, advantages, manner of operation and novel features of the present invention will be best understood from the following detailed description when read in conjunction with the accompanying drawings, in which:

FIG. 6 shows waveforms of control signals employed in the embodiment shown in FIG. 4.

Figure 1:
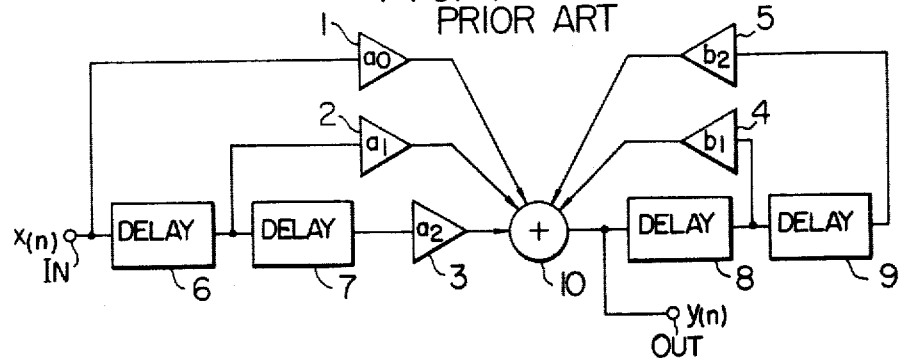
FIG. 1 is a circuit diagram for explaining the fundamental circuit construction of a conventional recursive type digital filter.

In order to clarify the difference between a digital filter according to the present invention and conventional digital filters, the construction of a conventional recursive type digital filter will first be explained below with reference to FIG. 1. In FIG. 1, reference symbol IN denotes a filter input terminal to which an L-bit digital input x(n) is applied bit by bit, and OUT a filter output terminal which delivers an L-bit digital signal y(n) bit by bit. Reference numerals 1, 2, 3, 4 and 5 denote coefficient multipliers for multiplying their inputs by $a_0$, $a_1$, $a_2$, $b_1$ and $b_2$, respectively, and 6, 7, 8 and 9 signal delaying shift registers for delaying their inputs by one sampling period. Further, reference numeral 10 indicates an adder for summing the outputs of the coefficient multipliers 1, 2, 3, 4 and 5. As is seen from FIG. 1, this filter is a second-order/second-order filter. In more detail, the highest order of time lag of the input signal x(n) to be applied to the adder is equal to 2, and the highest order of time lag of the feedback signal y(n) is also equal to 2. Accordingly, the input signal x(n) and the feedback signal y(n) satisfy the following equation (2), which can be derived from equation (1):

$$y(n) = a_0 x(n) + a_1 x(n-1) + a_2 x(n-2) + b_1 y(n-1) + b_2 y(n-2) \quad (2)$$

Let us consider a case where the coefficients $a_0$, $a_1$, $a_2$, $b_1$ and $b_2$ assume, for example, such values as mentioned below:

$$\left. \begin{array}{l} a_0 = 0.361328125 \\ a_1 = -0.447265625 \\ a_2 = 0.36328125 \\ b_1 = 1.2685546875 \\ b_2 = -0.548828125 \end{array} \right\} \quad (3)$$

The maximum value $y_{max}(n)$ of the output of the filter in a case where the initial value of each signal delaying shift register is made equal to zero and the maximum value of x(n) is made equal to 1, is given by the following equation:

$$y_{max}(n) = \sum_{n=0}^{\infty} |h(n)| \quad (4)$$

where h(n) indicates the impulse response of the filter. In other words, $y_{max}(n)$ becomes equal to 1.28. Owing to such a large value of $y_{max}(n)$, when each of the signal delaying shift registers 6 to 9 has a bit length of L, that is, contains L bits which are equal to the number of bits of the digital signals x(n) and y(n), an overflow is caused in the shift registers 8 and 9 of the feedback circuit, and therefore it is not possible to perform the filtering operation in accordance with a predetermined transfer function.

Figure 2:
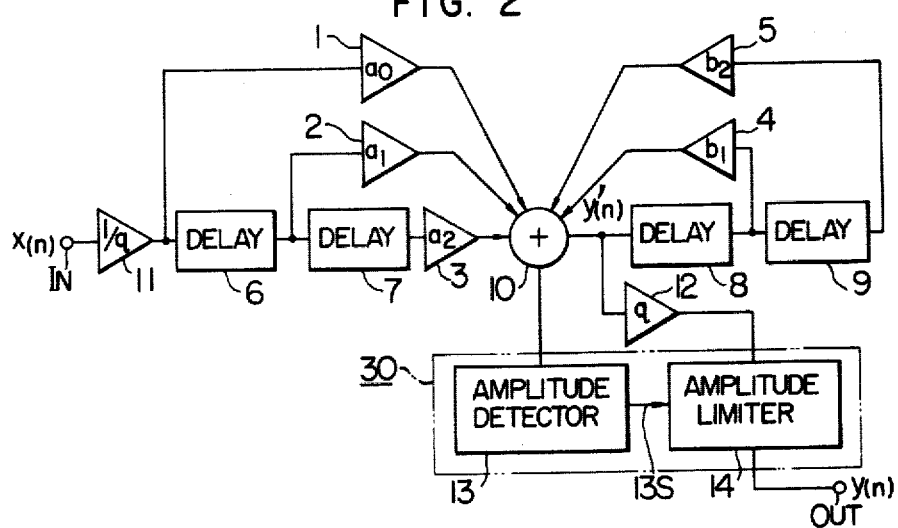
FIG. 2 is a circuit diagram showing the fundamental construction of a digital filter according to the present invention.

FIG. 2 shows the fundamental construction of a digital filter according to the present invention, and indicates circuit elements corresponding to those in FIG. 1 by the same reference symbols and numbers. In FIG. 2, reference numeral 11 denotes a coefficient multiplier for compressing the amplitude of an input signal at a predetermined rate, e.g., to one-qth thereof, 12 a coefficeint multiplier for multiplying the compressed output signal by q when the signal is outputted, 13 an amplitude detector for producing a signal when the result of calculation in the adder 10 becomes greater than a predetermined value, and 14 an amplitude limiter for controlling the amplitude of the signal y(n) to be sent out to the filter output terminal OUT, on the basis of an output signal 13S of the amplitude detector.

When the input and output data x(n) and y(n) have a bit length of L, the values of these data as represented by a notation employing the two's complement, lie within a range from $-2^{L-1}$ to $2^{L-1}-1$.

According to the circuit construction shown in FIG. 2, the amplitude of the input signal is compressed by the coefficient multiplier 11 to one-qth of the orginal one, so that even when the coefficients shown in equations (3) are employed, the arithmetic operation can be performed without suffering from any overflow in the shift registers 8 and 9 of the feedback circuit.

Further, the amplitude detector 13 delivers the signal 13S when the output y'(n) of the adder 10 becomes greater than one-qth of the maximum output $y_{max}(n)$, so that the amplitude limiter 14 clips the output y(n) at the positive or negative maximum value $\pm y_{max}(n)$ of the output y(n) in response to the signal 13S.

Figure 3:
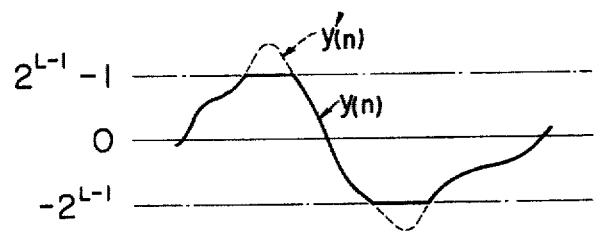
FIG. 3 is a waveform diagram showing a relation between an output signal y(n) of a digital filter and a signal y'(n) employed in the calculation within the digital filter according to the present invention.

As is apparent from the foregoing description, according to the present invention, the signal y'(n) such as shown in FIG. 3 is fed back within the filter to perform an arithmetic operation correctly while the filter sends to an external circuit the output signal y(n) which has a maximum amplitude clipped to $2^{L-1}-1$ or $-2^{L-1}$ for approximation to a correct output signal.

Incidentally, the coefficient multiplier 11 may be omitted by making the coefficients of the coefficient multipliers 1, 2 and 3 equal to $a_0/q$, $a_1/q$ and $a_2/q$, respectively.

Now, explanation will be made on an embodiment of the present invention with reference to FIGS. 4, 5 and 6.

Figure 4:
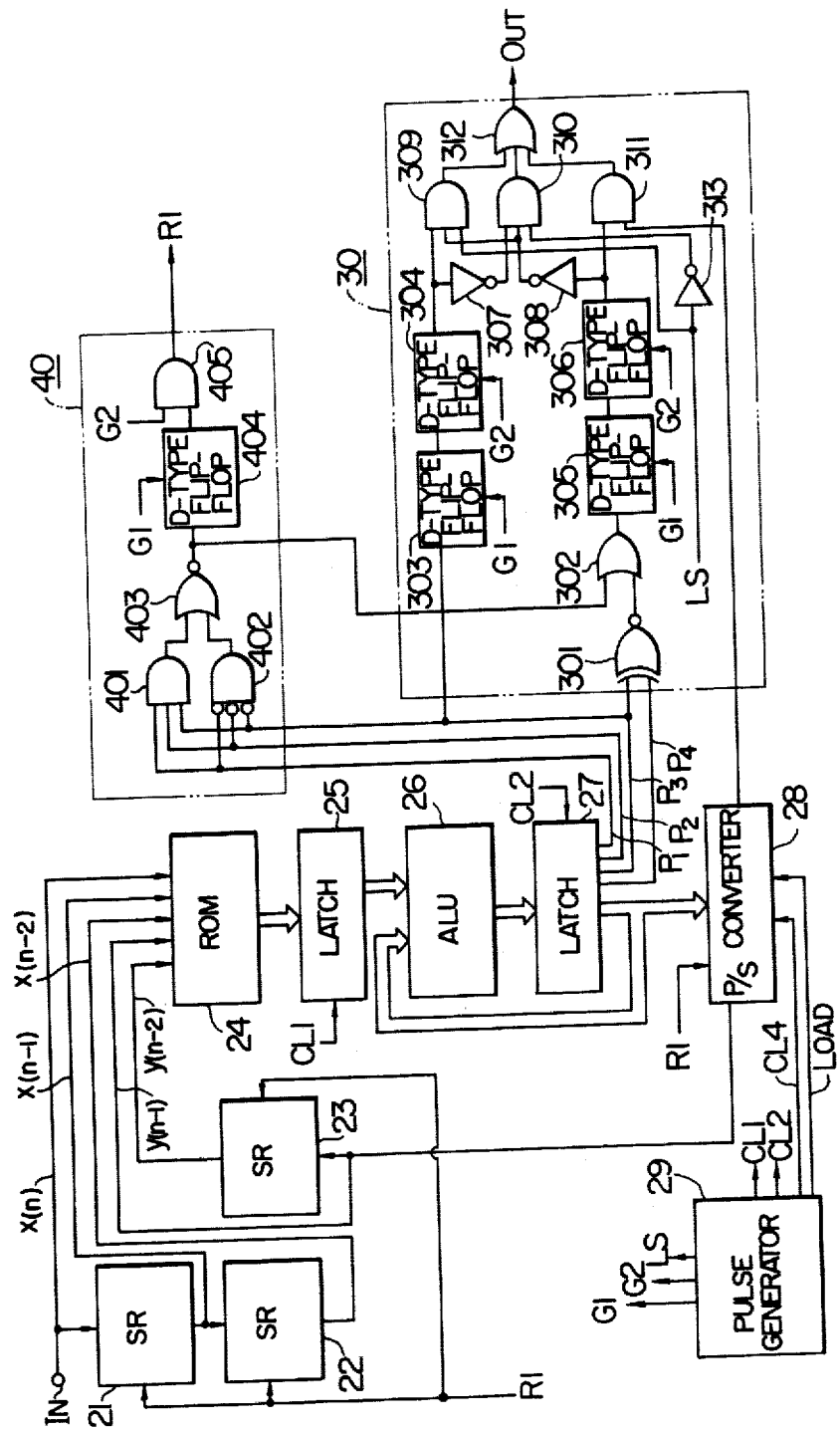
FIG. 4 is a block diagram showing an embodiment of a digital filter according to the present invention.

FIG. 4 shows the whole construction of a combinatorial-type second-order/second-order digital filter according to the present invention. In FIG. 4, reference numerals 21 and 22 denote shift registers for delaying signals on the side of the input signal x(n), 23 a shift register for delaying a feedback signal on the side of the output signal y(n). Numeral 24 denotes a read only memory (ROM), 25 a latch circuit constituted by, for example, a flip-flop circuit for latching the output of the ROM 24, 26 an arithmeticlogic unit (ALU) having such operational functions as addition and subtraction, 27 a latch circuit constituted by, for example, a flip-flop circuit for latching the output of the ALU 26, 28 a shift register (parallel-series converter) for converting parallel data into series data, 29 a pulse generator for generating timing pulses G1, G2, CL1, CL2, CL4, LOAD and a limit signal LS which are used to control the above-mentioned elements with such timing as shown in FIG. 6, 30 an output control circuit corresponding to a circuit made up of the amplitude detector 13 and the amplitude limiter 14 shown in FIG. 2, and 40 an overflow detector producing a signal R1 when the data of the latch circuit 27 become greater than the data capacity of the shift register 23, to reset each of the shift registers 21, 22, 23 and 28.

Now, explanation will be made for a case where a combinatorial type digital filter is employed. In this case, equation (2) can be rewritten by the use of the following relation:

$$\left. \begin{array}{l} x(n) = -x_n^o + \sum_{j=1}^{B-1} x_n^j 2^{-j} \\ y(n) = -y_n^o + \sum_{j=1}^{B-1} y_n^j 2^{-j} \end{array} \right\} \quad (5)$$

where $x_n^j$ indicates the (j+1)th bit of x(n), and $y_n^j$ the (j+1)th bit of y(n).

That is, the following equation is obtained:

$$y(n) = -\phi(x_n^o, x_{n-1}^o, x_{n-2}^o, y_{n-1}^o, y_{n-2}^o) + \qquad (6)$$
$$\sum_{j=1}^{B-1} \phi(x_n^j, x_{n-1}^j, x_{n-2}^j, y_{n-1}^j, y_{n-2}^j)$$
where $\phi(x_n^j, x_{n-1}^j, x_{n-2}^j, y_{n-1}^j, y_{n-2}^j) =$
$$a_0 x_n^j + a_1 x_{n-1}^j + a_2 x_{n-2}^j + b_1 y_{n-1}^j + b_2 y_{n-2}^j \qquad (7)$$

The above-mentioned $\phi$'s have been stored in the ROM 24. The stored $\phi$'s are addressed by the bits $x_n^j$, $x_{n-1}^j$, $x_{n-2}^j$, $y_{n-1}^j$ and $y_{n-2}^j$, and are read out to perform the operation indicated by equation (6).

As has been previously mentioned, when the coefficients $a_0$, $a_1$, $a_2$, $b_1$ and $b_2$ satisfy the equations (3), the maximum value $y_{max}$ of the output is equal to 1.28. Accordingly, a value less than or equal to 1.28 has to be allowed in the calculation within the digital filter. According to the present embodiment, the absolute value $|y_{max}|$ of the maximum value $y_{max}$ is made equal to or less than 1 by multiplying the coefficients $a_0$, $a_1$ and $a_2$ by 0.5. Further, when the output is taken out of the shift register 28, the output signal is shifted by one bit in order to double the gain of the shift register, thereby compensating the signal compression which has been made by multiplying the coefficients by 0.5. In other words, according to this method, the maximum allowable signal amplitude can be equivalently enlarged without largely changing the circuit construction. Needless to say, the reciprocal of the x-th power of 2 which reciprocal is not larger than 1/1.28, may be employed in place of the multiplier 0.5.

Figure 5:
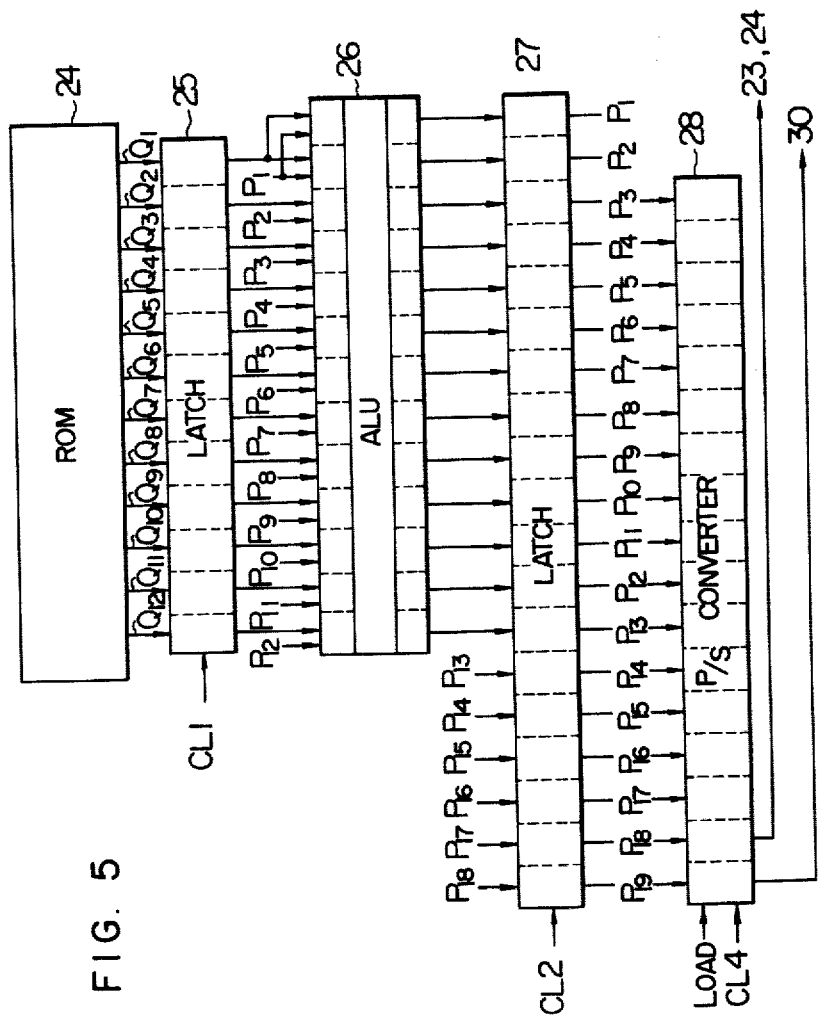
FIG. 5 is a view for explaining the operation of an arithmetic part of the embodiment shown in FIG. 4.

FIG. 5 shows interconnection among the ROM 24, latch circuit 25, ALU 26, latch circuit 27 and shift register (parallel-series converter) 28, in a case where input and output digital data have a bit length of 16.

In order to obtain a desired frequency characteristic, the coefficient data shown in equation (7) are stored in the ROM 24 wherein bit $Q_1$ is a sign bit, $Q_2$ a single bit representative of the integer part of data and ten bits $Q_3$ to $Q_{12}$ representative of the fraction part of data. The latch circuit 25 has 12 bits which are equal to the number of bits of the data stored in the ROM 24 and latches the output of the ROM 24 in response to the timing clock pulse CL1. In the ALU 26, addition or subtraction is carried out between 12-bit ($Q_1$ to $Q_{12}$) data read out of the ROM 24 and 12-bit data given by the upper twelve bits ($P_1$ to $P_{12}$) of the data which have been obtained by calculation and held in the latch circuit 27. In this case, there is a concern that the numerical value will be increased to a maximum value 2.38 in the course of calculation, if the previously-mentioned coefficient values are employed. Accordingly, the ALU 26 has 13 bits, and the upper three bits are used to indicate the sign and integer part of the data.

The latch circuit 27 has 19 bits ($P_1$ to $P_{19}$), and the upper thirteen bits thereof receive the output of the ALU 26 in response to the clock pulse CL2. After being shifted to the left by one bit, the upper twelve bits ($P_1$ to $P_{12}$) of the output data of the latch circuit 27 are applied to the ALU 26, while the six bits ($P_{13}$ to $P_{18}$) of the output data of the latch circuit 27 are applied to the bit positions $P_{14}$ to $P_{19}$ of the latch circuit 27. Thus, the content of the latch circuit 27 is shifted to the left by one bit each time a latch operation is performed.

The shift register 28 (parallel-series converter) has 17 bits and takes in the output data at the bit positions $P_3$ to $P_{19}$ of the latch circuit 27 in response to the pulse LOAD. The upper sixteen bits data ($P_3$ to $P_{18}$) contained in the shift register 28 are successively sent out in the sequence of from lower to higher order bits in response to the clock pulse CL4 to supply feedback data to the ROM 24 and delaying shift register 23. In this embodiment, since the input data x(n) are compressed to one-half of the original value to perform a correct calculation within the filter, 16-bit data ($P_{19}$ to $P_4$) which is shifted to the left by one bit as compared with the above-mentioned feedback data are successively sent out in the sequence of from lower to higher order bit to supply the output signal y(n) to the output control circuit 30.

Now, explanation will be made on the output control circuit 30 which constitutes the main feature of the present invention and on the overflow detector 40, with reference to FIG. 4. In FIG. 4, the output control circuit 30 enclosed with a broken line is divided into two parts, one of which is an exclusive NOR circuit (EX-NOR) 301 and corresponds to the amplitude detector 13 shown in FIG. 2, and the other part includes the remaining portions of the output control circuit 30 and corresponds to the amplitude limiter 14.

The EXNOR 301 is supplied with the bits $P_3$ and $P_4$ of the output of the latch circuit 27. When respective values of the bits $P_3$ and $P_4$ are equal to each other, the output of the EXNOR 301 assumes the level of "1". As has been explained previously, the bit $P_4$ is the most significant bit (MSB) of the data which are sent out from the shift register 28 as the filter output y(n), and is used as the sign bit. The radix point lies between the bits $P_4$ and $P_5$. Accordingly, when the values of the bits $P_3$ and $P_4$ are equal to each other, it is meant that $|y(n)|$ is less than 1. When the values of the bits $P_3$ and $P_4$ are different from each other, $|y(n)|$ is greater than or equal to 1. That is, when the EXNOR 301 detects the relation $|y(n)|<1$, it delivers the output having the level of "1".

The output of the EXNOR 301 is applied through an OR gate 302 to a D-type flip-flop 305 to be latched therein with a timing of the pulse G1, and is further latched in a D-type flip-flop 306 with a timing of the pulse G2. The output having the level "1" the flip-flop 306 opens an AND gate 311, and the output having the level "0" is inverted by an inverter 308 to open either one of AND gates 309 and 310. It depends upon the value of the bit $P_3$ from the latch circuit 27 which of the AND gate 309 and the AND gate 310 is opened. The value of the bit $P_3$ is further latched in D-type flip-flops 303 and 304 with timings of the pulses G1 and G2, respectively. The AND gate 309 is selected when the output of the flip-flop 304 assumes the level "1", namely, when data contained in the latch circuit 27 are negative. The AND gate 310 is selected when inversion of the output of the flip-flop 304 by an inverter 307 provides the level "1", namely when the above data are positive. The AND gate 311 controls the passage of the external output data ($P_{19}$ to $P_4$) of the shift register 28. When the absolute value of $y(n)$ is less than 1, the above output data are sent to the output terminal OUT through an OR gate 312. When the absolute value of $y(n)$ is greater than or equal to 1, the limit signal LS delivered from the pulse generator 29 or the inversion of the limit signal by the inverter 313 is allowed to pass through the AND gate 309 or 310, respectively, and are sent through the OR gate 312 to the output terminal OUT. As is apparent from the waveform shown in FIG. 6(I), the limit signal LS assumes the level "1" at the position of the most significant bit (MSB) of the input data, and assumes the level "0" at the remaining bit positions. Accordingly, the AND gate 309 delivers data in which the sign bit assumes the level "1" and all of the numerical value representing bits assume the level "0", namely, data indicating a negative limit value. Meanwhile, the AND gate 310 delivers data in which the sign bit assumes the level "0" and all of the numerical value representing bits assume the level "1", namely, data indicating a positive limit value.

For prevention of the overflow oscillation which may be caused in a case where a value set for the shift register 23 of the feedback circuit exceeds an allowable value due to turn-on of a power supply switch or external noise signal, there is provided the overflow detector 40. The detector 40 discriminates whether the result of calculation in the filter is greater in absolute value than 1 or not, on the basis of the upper three bits $P_1$, $P_2$ and $P_3$ of the output data from the latch circuit 27. When the absolute value of the result of calculation exceeds 1, the detector 40 delivers a signal R1 to reset the shift register 21, 22 and 23. The above operation of the detector 40 will be explained below in more detail. The above bits $P_1$, $P_2$ and $P_3$ correspond to the sign representing part or the integer representing part of the result of calculation. Accordingly, as long as the absolute value of the result of calculation does not exceed 1, these three bits $P_1$, $P_2$ and $P_3$ assume the state "000" or "111". Each of an AND gate 401 and an NOR gate 402 is supplied with the above-mentioned bits $P_1$, $P_2$ and $P_3$, and the output of each of the gates 401 and 402 is applied to an NOR gate 403. When an overflow is caused as a result of calculation, the NOR gate 403 delivers an output assuming the level "1", which is latched in a D-type flip-flop 404 with timing of the pulse G1, and passes through an AND gate 405 with a timing of the pulse G2 to generate the reset signal R1.

It should be noted that, in the present invention, since the input signal $x(n)$ is subject to such compression that any overflow does not take place on the final result of calculation even if the overflow is temporarily caused in the course of calculation within the filter, the overflow detector 40 delivers the reset signal only in a special case.

Referring again to FIG. 4, the output of the NOR gate 403 which is included in the overflow detector 40, is applied to the OR gate 302 in the amplitude limiter 30. Accordingly, when an overflow is detected, the output signal of the shift register 28 is sent out to the output terminal OUT. In this case, however, the output signal sent from the output terminal OUT becomes zero, since the contents of the shift register 28 have been reset by the reset signal R1.

As is apparent from the foregoing explanation, according to the present invention, there is provided an improved digital filter which delivers the result of calculation as it is when the result of calculation is not greater than an allowable value of output signal $y(n)$, which delivers a limit value when the result of calculation exceeds the allowable value, and which delivers zero output when an overflow which will disturb a correct calculation is caused.

In the above-mentioned embodiment, the coefficients $a_k$ with respect to the input signal $x(n)$ and to the delayed signals thereof $x(n-1)$ and $x(n-2)$ are made smaller than predetermined values to compress the signal amplitude within the filter. The present invention is not limited to the above construction. The bit length of the shift register which is included in the feedback circuit, may be larger without changing the coefficients $a_k$. In this case, however, the hardware of the filter may become somewhat complicated.

What is claimed is:

1. A recursive type digital filter comprising:
an arithmetic unit having an input and output means for delivering from the output means thereof a digital signal $y(n)$ shown by a formula, $$y(n) = \sum_{k=0}^{M} a_k \cdot x(n-k) + \sum_{k=1}^{N} b_k \cdot y(n-k)$$

where n represents a natural number, N and M are orders representing a delay of signal transmission, and $a_k$ and $b_k$ are coefficients with $a_M$, $b_N \neq 0$;

first means connected to said input means for applying digital signals $x(n-k)$ to said arithmetic unit, said digital signal $x(n-k)$ having a plurality of bits and including at least an input digital signal $x(n)$ applied thereto at a predetermined sampling period;

second means connected between the output means and the input means of said arithmetic unit for feeding back at least a digital signal $y(n-k)$ to the input means of said arithmetic unit, said digital signal $y(n-k)$ having a plurality of bits, said second means including a signal delaying means for delaying a digital signal delivered from the output means of said arithmetic unit by at least one sampling period to feed the so delayed signal back to the input means of said arithmetic unit;

a filter output terminal coupled to the output means of said arithmetic unit for delivering a digital signal y(n) as the output of the filter;

third means connected to said arithmetic unit for detecting that the amplitude of said digital signal y(n) to be applied to said filter output terminal exceeds a predetermined value;

fourth means, connected between said filter output terminal and said third means and controlled by said third means, for sending to said filter output terminal a digital signal indicating either one of positive and negative limit values in place of said digital signal y(n) from said arithmetic unit; and fifth means connected to said arithmetic unit for detecting that the value of said digital signal to be applied from said arithmetic unit to said second means exceeds the data capacity of said signal delaying means, at least the contents of said signal delaying means and the contents of the output means of said arithmetic unit being zero-cleared by means of the output signal of said fifth means.

2. A recursive type digital filter according to claim 1, wherein said first means further includes signal delaying means for delaying said input digital signal x(n) by at least one sampling period to apply the so delayed signal to the input means of said arithmetic unit.

3. A recursive type digital filter according to claim 1, wherein said fourth means sends to said filter output terminal an output digital signal of said arithmetic unit having a value of zero, in response to said output signal of said fifth means.

4. A recursive type digital filter according to claim 1 or 3, wherein said arithmetic unit comprises:

data storage means, as said input means coupled to said first and second means, having stored therein data representative of sums of multiplications of a plurality of bits by coefficients $a_k$ and $b_k$ to allow the data to be read out therefrom by addressing said data storage means with said signal x(n−k) and y(n−k), respectively; and adding means coupled to an output of said data storage means for adding to the outputs of said data storage means at every sampling period thereby to output a parallel digital data y(n);

the output means for said arithmetic unit being connected to said adding means for converting the parallel digital data into a serial digital signal to be outputted therefrom.

5. A recursive type digital filter according to claim 4, wherein said data storage means stores therein data calculated by the use of a value obtained by reducing said coefficient $a_k$ corresponding to said signal x(n−k) at a predetermined ratio, and wherein said output means comprises a shift register means having a plurality of bit positions, said shift register means successively sends out the addition data obtained in said adding means to said filter output terminal from that bit position which represents that the value of said addition data is made large at a ratio corresponding to said predetermined ratio.

6. A recursive type digital filter according to claim 5, wherein said shift register means sends a digital signal to said second means from a bit position thereof which is different from said bit position for sending out said addition data to said filter output terminal.

7. A recursive type digital filter according to claim 3, wherein said first means includes a first coefficient multiplier for compressing the amplitude of said signal x(n) at a predetermined ratio, and wherein said arithmetic unit includes at least one second coefficient multiplier for multiplying said digital signal x(n−k) supplied from said first means by said coefficient $a_k$, at least one third coefficient multiplier for multiplying said digital signal y(n−k) supplied from said second means by said coefficient $b_k$, an adder for summing respective outputs of said second and third coefficient multipliers, and a fourth coefficient multiplier for expanding the amplitude of the output signal of said adder at a ratio corresponding to said predetermined ratio to compensate said compression of amplitude made by said first coefficient multiplier.

8. A recursive type digital filter comprising:

an arithmetic unit having an input and output means for delivering from the output means thereof first and second digital signals, said first digital signal being shown by a formula, $$y(n) = \sum_{k=0}^{M} a_k \cdot x(n-k) + \sum_{k=1}^{N} b_k \cdot y(n-k)$$

where n represents a natural number, N and M are orders representing a delay of signal transmission, and $a_k$ and $b_k$ are coefficients with $a_M$, $b_N \neq 0$, and said second digital signal having an amplitude which is reduced from that of said first signal by a predetermined ratio;

first means connected to said input means for applying digital signals x(n−k) to said arithmetic unit, said digital signal x(n−k) having a plurality of bits and including at least an input digital signal x(n) applied thereto at a predetermined sampling period;

second means connected between the output means and the input means of said arithmetic unit for feeding back said second digital signal as said digital signal y(n−k) to the input means of said arithmetic unit, said digital signal y(n−k) having a plurality of bits;

a filter output terminal coupled to the output means of said arithmetic unit for delivering said first digital signal as the output of the filter;

third means connected to said arithmetic unit for detecting that the amplitude of said first digital signal to be applied to said filter output terminal exceeds a predetermined value; and fourth means, connected between said filter output terminal and said third means and controlled by said third means, for sending to said filter output terminal a digital signal indicating either one of positive and negative limit values in place of said first digital signal from said arithmetic unit, while keeping the value of said second digital signal to be fed back to the input means of said arithmetic means unchanged by the limmit values.

9. A recursive type digital filter according to claim 8, wherein said first means includes first signal delaying means for delaying said input digital signal x(n) by at least one sampling period to apply the so delayed signal to the input means of said arithmetic unit, and said second means includes second signal delaying means for delaying said second digital signal delivered from the output means of said arithmetic unit by at least one sampling period to feed the so delayed signal back to the input means of said arithmetic unit.

10. A recursive type digital filter according to claim 8 or 9, wherein said arithmetic unit comprises:

data storage means, as said input means coupled to said first and second means, having stored therein data representative of sums of multiplications of a plurality of bits by coefficients $a_k$ and $b_k$ to allow the data to be read out therefrom by addressing said data storage means with said signal $x(n-k)$ and $y(n-k)$, respectively, said data being calculated by the use of a value obtained by reducing said coefficient $a_k$ corresponding to said signal $x(n-k)$ at said predetermined ratio;

adding means coupled to an output of said data storage means for adding the outputs of said data storage means at every sampling period thereby to output a parallel digital data; and a shift register means having a plurality of bit positions, as said output means for said arithmetic unit, connected to said adding means for successively sending out the addition data obtained in said adding means as said first digital signal from that bit position which represents that the value of said addition data is made large at a ratio corresponding to said predetermined ratio, said shift register means sending said second digital signal to said second means from a bit position thereof which is different from said bit position for sending out said first digital signal.

11. A recursive type digital filter according to claim 8, wherein said first means includes a first coefficient multiplier for compressing the amplitude of said signal $x(n)$ at a predetermined ratio, and wherein said arithmetic unit includes at least one second coefficient multiplier for multiplying said digital signal $x(n-k)$ supplied from said first means by said coefficient $a_k$, at least one third coefficient multiplier for multiplying said digital signal $y(n-k)$ supplied from said second means by said coefficient $b_k$, an adder for summing respective outputs of said second and third coefficient multipliers, and a fourth coefficient multiplier for expanding the amplitude of the output signal of said adder at a ratio corresponding to said predetermined ratio to compensate said compression of amplitude made by said first coefficient multiplier.

* * * * *